US008238098B1

United States Patent
Rivas

(10) Patent No.: US 8,238,098 B1
(45) Date of Patent: Aug. 7, 2012

(54) NANO MACHINED MATERIALS USING FEMTOSECOND PULSE LASER TECHNOLOGIES TO ENHANCED THERMAL AND OPTICAL PROPERTIES FOR INCREASED SURFACE AREA TO ENHANCED HEAT DISSIPATION AND EMISSIVITY AND ELECTROMAGNETIC RADIATION

(76) Inventor: Victor A. Rivas, Lincoln, NE (US)

( * ) Notice: Subject to any disclaimer, the term of this patent is extended or adjusted under 35 U.S.C. 154(b) by 0 days.

(21) Appl. No.: 12/316,253

(22) Filed: Dec. 10, 2008

Related U.S. Application Data

(60) Provisional application No. 61/005,997, filed on Dec. 10, 2007.

(51) Int. Cl.
*H05K 7/20* (2006.01)
(52) U.S. Cl. ........ 361/688; 361/704; 361/708; 361/709; 361/710; 165/80.3; 165/185; 257/706; 257/707; 257/712; 257/713
(58) Field of Classification Search .................. None
See application file for complete search history.

(56) References Cited

U.S. PATENT DOCUMENTS

| | | | | |
|---|---|---|---|---|
| 5,294,831 | A * | 3/1994 | Azar et al. | 257/722 |
| 6,621,040 | B1 * | 9/2003 | Perry et al. | 219/121.67 |
| 6,627,844 | B2 * | 9/2003 | Liu et al. | 219/121.71 |
| 6,800,828 | B2 * | 10/2004 | Golecki | 219/69.17 |
| 6,907,921 | B2 * | 6/2005 | Insley et al. | 165/170 |
| 7,262,487 | B2 * | 8/2007 | Farnworth et al. | 257/632 |
| 7,440,280 | B2 * | 10/2008 | Shuy | 361/701 |
| 7,545,640 | B2 * | 6/2009 | Fisher et al. | 361/694 |
| 7,651,253 | B2 * | 1/2010 | Shuy | 362/547 |
| 2004/0188066 | A1 * | 9/2004 | Upadhya et al. | 165/80.4 |
| 2005/0263269 | A1 * | 12/2005 | Kaneko et al. | 165/146 |
| 2006/0102601 | A1 * | 5/2006 | Shirk et al. | 219/121.68 |
| 2006/0157234 | A1 * | 7/2006 | Golecki | 165/170 |
| 2008/0216926 | A1 * | 9/2008 | Guo et al. | 148/565 |
| 2008/0299408 | A1 * | 12/2008 | Guo et al. | 428/573 |
| 2010/0099268 | A1 * | 4/2010 | Timans | 438/761 |
| 2010/0219506 | A1 * | 9/2010 | Gupta et al. | 257/618 |

* cited by examiner

*Primary Examiner* — Boris Chervinsky
(74) *Attorney, Agent, or Firm* — James Creighton Wray

(57) ABSTRACT

Microprocessor, miniprocessor and heat sink surfaces having increased surface areas and increased heat dissipation are femtosecond pulsed laser machined. Nano structures formed and created on surfaces by the femtosecond pulsed laser machining provide increased surface areas which radiate heat by intensified IR radiation.

13 Claims, 16 Drawing Sheets

Nano Surface on the Stainless Steel

SEM Images of Stainless Steel before and after Laser machining 1 mm Thick Stainless Steel Infrared (IR) Light

- All object emit light of different wavelength depending on there temperature
- Objects at room temperature radiate in the IR
- IR wavelength is 1 μm to 1000 μm in the EM Spectrum
- Objects would begin to glow red when there temperature began to approach 1112° F Spitfire Femtosecond Laser
Regenerative Amplifier Diagram

FIG. 7
ThermaCam S65HSV Infrared Camera

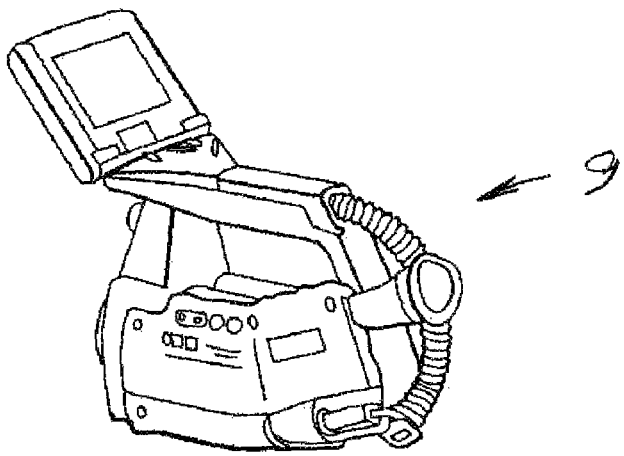

Thermal sensitivity of 0.05C
640 x 480 pixels, full color
High-resolution 14-bit thermal images Temperature ranges:
Range 1: -40°C to + 120°C (-40°F to + 248°F)
Range 2: 0°C to + 250°C (+32°F to + 482°F)
Range 3 +100°C to +500°C (+212°F to +932°F)
Range 3 +250°C to +1500°C (+482°F to +2732°F)

Spectral range of detector:
7.5 μm to 13 μm (this is deep infared)

Accuracy: (% of reading)
± 2°C or ± 2% (3.6°F)

Emissivity corrections:
Variable from 0.1 to 1.0 or select from
listings in predefined material list

FIG. 8

Advantages of Femtosecond Pulses

| Femtosecond vs. Nanosecond | Description of Plasma Formation |
|---|---|
| * Nanosecond do not create the unique nano surface structures.<br><br>* Nanosecond pulses create large amounts of heating damage in the form of melting splatter and stress cracking.<br><br>* Femtosecond pulses arrive before the material plasma has time to form.<br><br>* Femtosecond pulses have improved repeatability over nanosecond pluses. | * In the first 100 fs electron heating and thermalization occurs.<br><br>* It takes a few ps for the hot electron gas to cool and energy to transfer to the material lattice.<br><br>* After tens of ps thermal diffusion into the sample bulk takes place.<br><br>* After nanoseconds the onset of thermal melting and ablation occurs. |

Infrared imaging of a Hot dog

Machining of Heat Sink

SEM Images of Heat Sink after Laser Machining

Machining of Mac Mini Intel-processor
Before Laser Machining / After Laser Machining Infrared Images of Mac Mini Mac Mini After Laser Machining

NANO MACHINED MATERIALS USING FEMTOSECOND PULSE LASER TECHNOLOGIES TO ENHANCED THERMAL AND OPTICAL PROPERTIES FOR INCREASED SURFACE AREA TO ENHANCED HEAT DISSIPATION AND EMISSIVITY AND ELECTROMAGNETIC RADIATION

This application claims the benefit of U.S. Provisional Application No. 61/005,997, filed Dec. 10, 2007, which is hereby incorporated by reference in its entirety.

The invention provides the use of Femtosecond Pulse Laser Technologies to create and enhance surface areas for better heat dissipation and emissivity in electronic and electrical devices.

The invention provides new improved heat dissipation and emissivity heat transfer nano surfaces for example to cool microprocessors and heat sinks.

Commercial opportunities are promising in electronic and electrical components; also equipment companies will find the new heat transfer surfaces useful and cost effective.

The invention will provide new jobs and integration of people with the skills and opportunities and the use of femtosecond pulse laser technologies to serve the electronic and electrical industries including companies involve in solar cells, fuel cells, batteries, lighting systems, space and defense applications.

The femtosecond pulse laser technologies enhanced emissivity and surfaces areas are useful, for example to accelerate cooling of microprocessors and heat sinks. For example radiated power after nano machining is over 78 times greater. This is due an increase in emissivity, temperature and surface areas. In an example, radiated power before nano machining was 131.5 W, after nano machining radiated power was 10,273.2 W, over 78 times greater.

The invention may be used by nano machining surfaces on parts or in steps of machining and die cutting foils on release sheets to peel off and place on microprocessors, heat sinks or other electronic or electrical components for example in LED thermal management applications.

Electrodes are nano machined for supercapacitors, fuel cells, batteries, solar cells hydrogen storage tanks, biosensors, smart antennas, and laser detectors.

The nano machining may be used in space to make satellites invisible and may be used for production of nano powders for different applications.

Nano machined filaments in lighting systems improve the ratio of visible light to heat generation and reduce filament degradation. When surface areas increased this will cause an increment in the filament's surfaces temperature from 6,175° F. to 6,583° F. plus an increment in its emissivity. This will improve the relative visibility of the electromagnetic radiation with more lumens per watt.

Fluorescent light electrodes are provided with more surface areas 21 plus times greater after nano machining.

Using this invention a material having 1 square inch may be equal to increment of 2100% of its original size or 21 times greater.

A typical 60 watt incandescent light bulb provides 850 lumens, with the lumens/watts ratio of 14.2 while lumens/watts ratio of a nano machined incandescent light bulb can be twice (28.4) times as much or more.

Femtosecond pulse laser nano structures can be formed on a large variety of metal and non-metal materials. They can be machined in an air environment and no sample preparation is needed. The process creates a surfaces covered with nano meter and micrometer size structures. This results in a large surface areas and a black appearance that have the potential to improve any application that relies on large surface areas.

The machining accelerates cooling of microprocessors by a factor of radiated power of 78 times greater when compared before nano machining, a 7800% increase in radiated power. Machined filaments increased in surface area, emissivity and temperature will increase radiated power 78 times or more.

SUMMARY OF THE INVENTION

The invention provides the use of femtosecond pulse laser technologies to create and enhance surface areas for better cooling electronic devices.

The invention provides new improved heat transfer surfaces, for example to cool microprocessors and miniprocessors. Commercial opportunity is promising. Electronic and electrical components and equipment companies will find the new heat transfer surfaces useful. The invention will provide new jobs and integration of people with the skills and opportunities in use of femtosecond pulsed lasers.

The femtosecond pulsed lasers enhanced surface areas are useful, for example, to accelerate cooling of microprocessors by factors up to 1,000 times or more. The invention may be used by machining surfaces of parts or in steps of machining and die cutting foils on release sheets to peel off and place on microprocessors or other electronic surfaces. Electrodes are machined for super capacitors to improve storage and biosensor surfaces are enhanced by using nano-machining. Nano-machined surfaces used in space make invisible satellites.

Machined filaments increase surface area and increase emissivity up to 1,000 times or more. Sixty watt bulbs may product 100% more lumens. The femtosecond pulsed laser technology enhances surfaces for sending heat and light out fast. The invention provides more efficient use of electrical surfaces, and light is emitted more cooler and brighter.

Fluorescent light electrodes are provided with more surface area and less material to create and sustain arcs.

Using the invention, a material having 1 square inch may equal 1,000 square inch of surface area. The minute nano size surface disruptions provide the increase in area. The new femtosecond pulsed laser technology uses $10^{-15}$ sec. (femtosecond) laser pulses to produce increased surface areas. Microprocessor sizes are limited by heat produced. Energy situations in every country require better power usage. Lighting bulbs and tubes more efficiently produce more lumen output, greater efficiency and longer life. Microprocessors that send off heat energy better and faster are important for enabling greater and faster computing power. $10^{-15}$ sec pulsed laser technology sculptures materials, producing enhanced surface areas to release wave energy. Femtosecond pulsed lasers form nano surface variations in calibrated depths and widths in metals, foils, and plastics to increase surface areas by surface sculpturing.

The new invention creates nano-surfaces for heat and power management in electronics. The new nano-machined metallic and nonmetallic materials are created using femtosecond laser technology. Applications of nanosurfaces formed with femtosecond lasers include improved heat and power management.

Heat loss in terms of infrared light and wave energy may be described by:

Radiated power: $P = c a A T^4$
$c$ = emissivity, $a$ = universal constant,
$A$ = area, $T$ = temperature in Kelvin (273 K = 0° C.)

Emissivity relates the radiated power to that of a blackbody, which is a perfect emitter and absorber with $c = 1$. Increased area results in increased radiated power. Temperature is raised to the fourth power indicating that a small temperature increase results in a large increase in radiated power.

The new femtosecond laser facility provides nano surfaces tailored to the customer's material and application. Current applications are being developed for several uses.

Microprocessors realize improved power dissipation for better heat management.

These and further and other objects and features of the invention are apparent in the disclosure, which includes the above and ongoing written specification, with the claims and the drawings.

BRIEF DESCRIPTION OF THE DRAWINGS

FIG. 7 shows an infrared camera and its specifications.

FIG. 8 is a charge of advantages of femtosecond pulses.

DETAILED DESCRIPTION OF THE DRAWINGS

Figure 1:
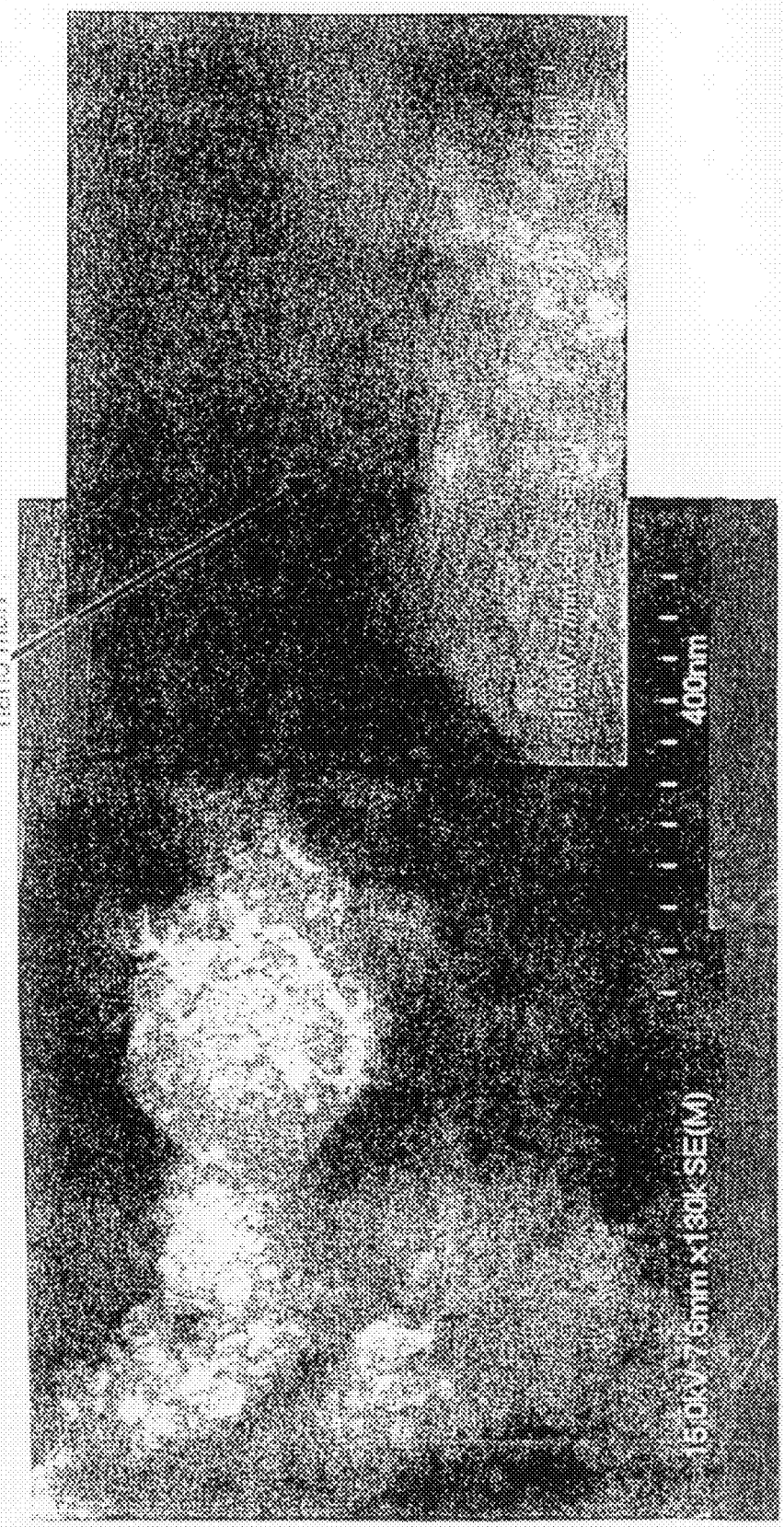
FIG. 1 shows nano surfaces on a stainless steel which were formed with femtosecond laser machining.

FIG. 1 shows nano surfaces on a stainless steel which were formed with femtosecond laser machining. SEM (scanning electron microscope) images shows the nano structures that were formed by the femtosecond laser machining. The image on the right shows the "nano man" with legs that are less than 10 mm thick.

Figure 2:
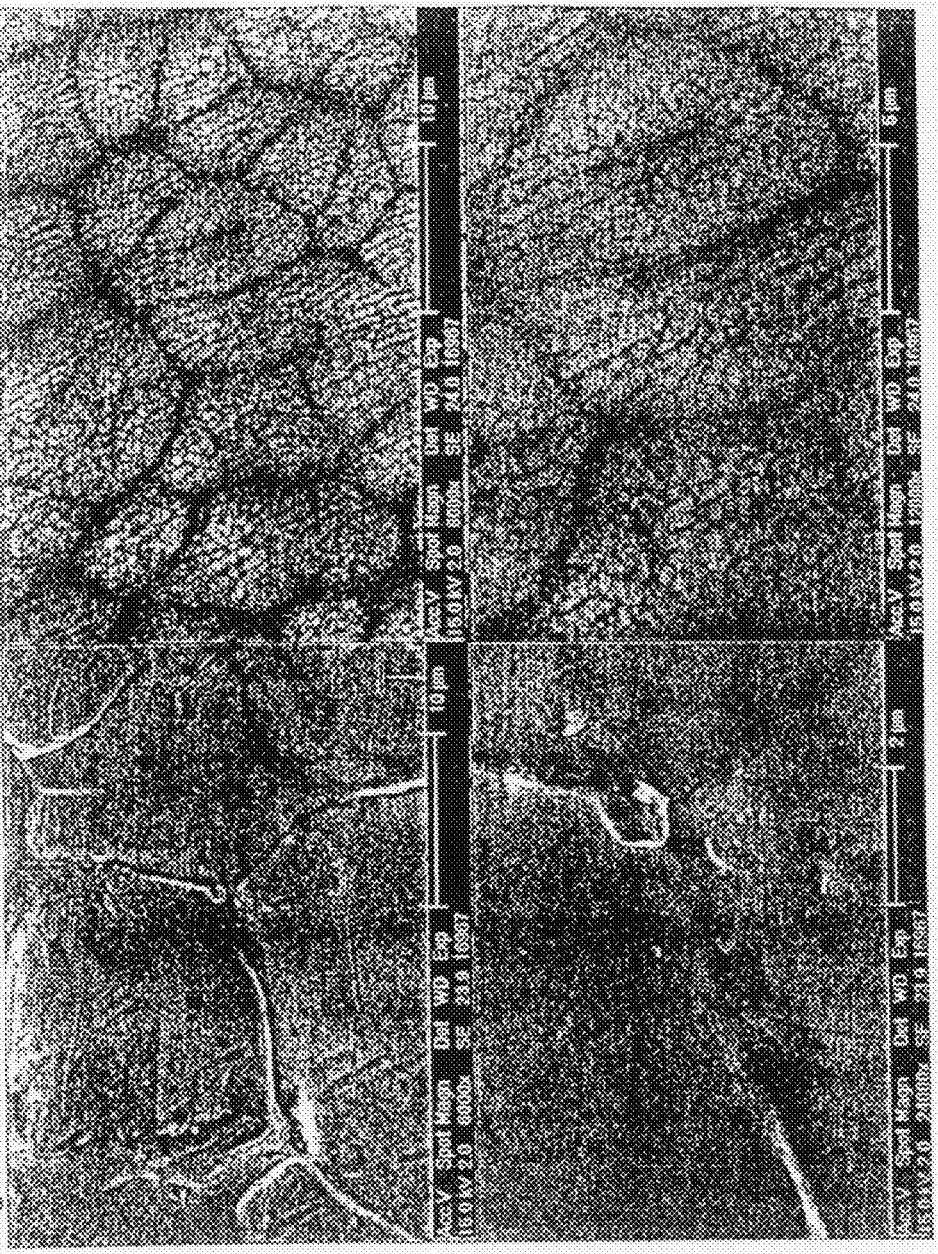
FIG. 2 shows scanning electron microscope images of stainless steel before and after laser machining.

FIG. 2 shows SEM images of stainless steel before and after laser machining. Images on the left show the metal surface before being machined by the femtosecond laser. The images on the right show the nano and micro surfaces that have been created by the laser machining process. The fuzzy appearance of the micro structures in the images on the right is due to the nano surface structures that have been formed by laser machining.

Figure 3:
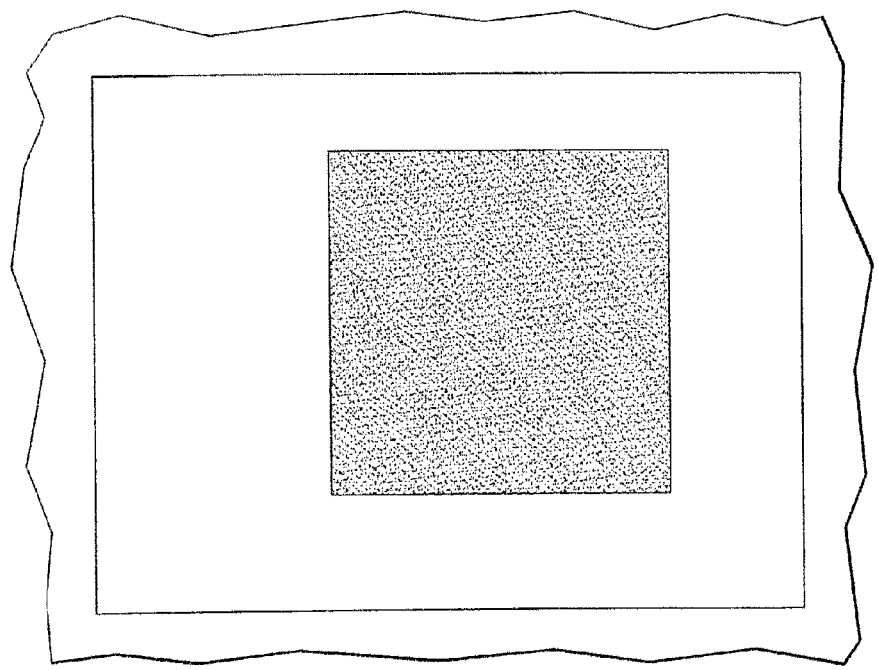
FIG. 3 shows a stainless steel blank with a 1 inch nano-machined area.

FIG. 3 shows a stainless steel square with a central femtosecond laser machined center.

1 inch square was machined into a 2 inch square stainless steel sample. The only optimization performed was of one parameter (distance between sample and focusing lens) to achieve the blackest surface possible.

Figure 3A:
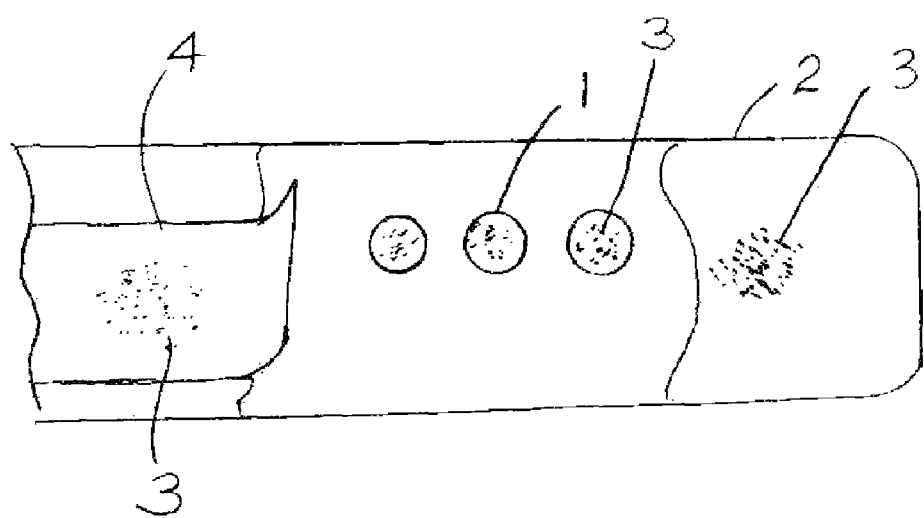
FIG. 3A shows electronic components, housings and foils having rapid heat dissipation surfaces having sub-micrometer irregularities machined by femtosecond pulsed laser machining.

FIG. 3A shows electronic components 1, housing 2, surfaces 3, foil 4, with rapid heat dissipation surfaces having sub-micrometer irregularities 5 machined by femtosecond pulsed laser machining.

Figure 4:
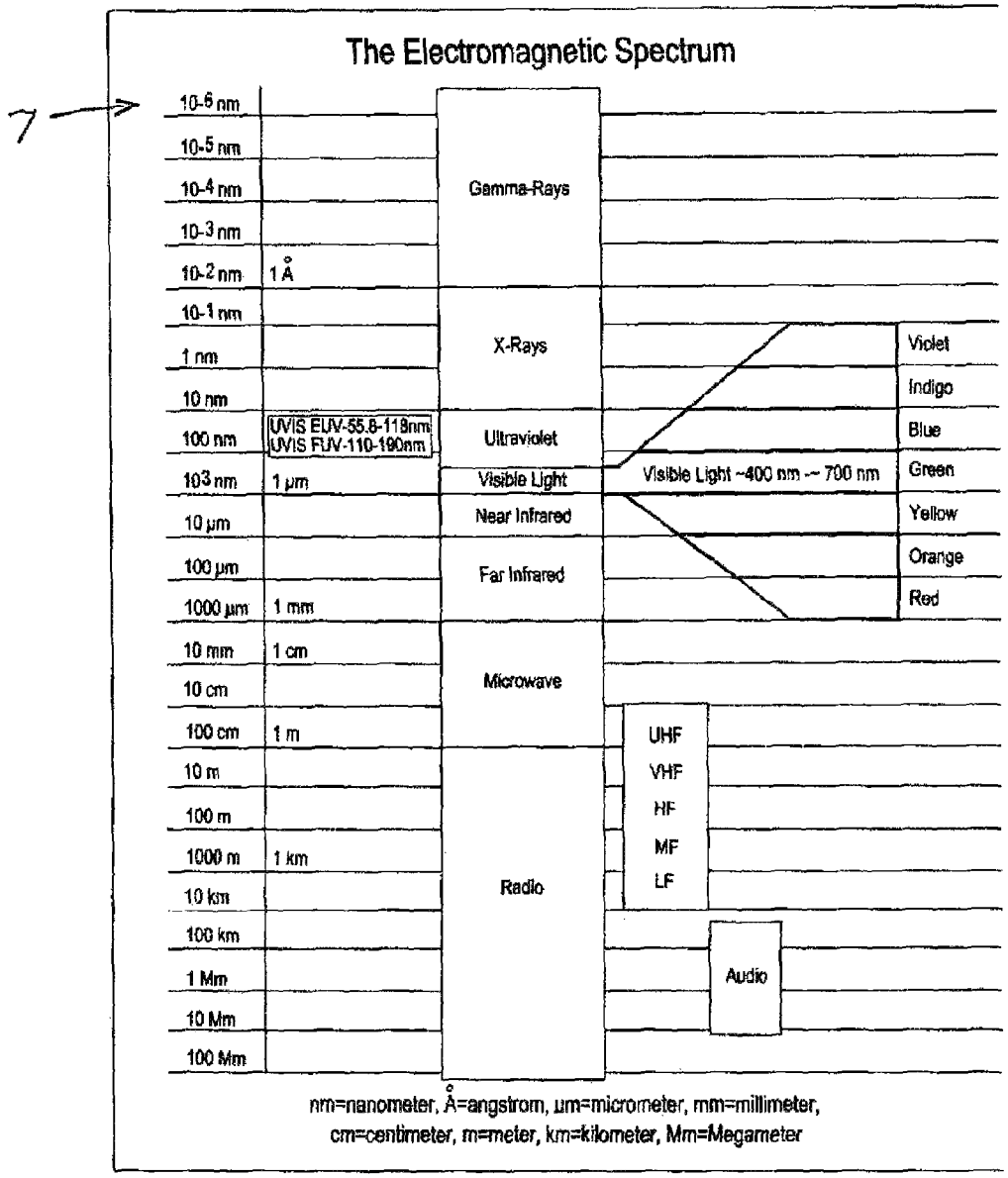
FIG. 4 shows a scale of light frequencies.

FIG. 4 shows infrared (IR) wavelengths 7 in the electromagnetic spectrum. All objects emit light of different Wavelength depending on their temperature. Objects at room temperature radiate in IR. IR wavelengths are from 1 μm to 1000 μm in the EM spectrum. Objects begin to glow red when their temperature began to approach 1112° F.

Figure 5:
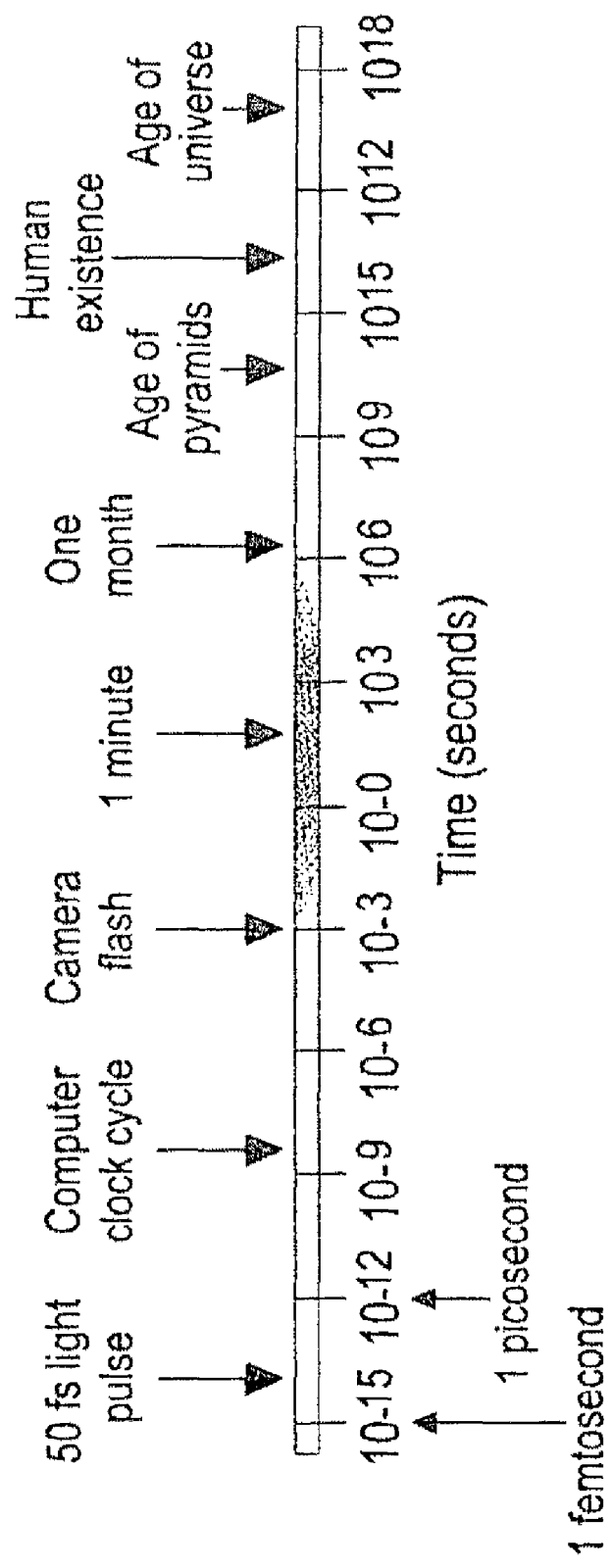
FIG. 5 shows a femtosecond time scale.

FIG. 5 shows time scale relationships of femtoseconds to one second and other time periods.

Figure 6:
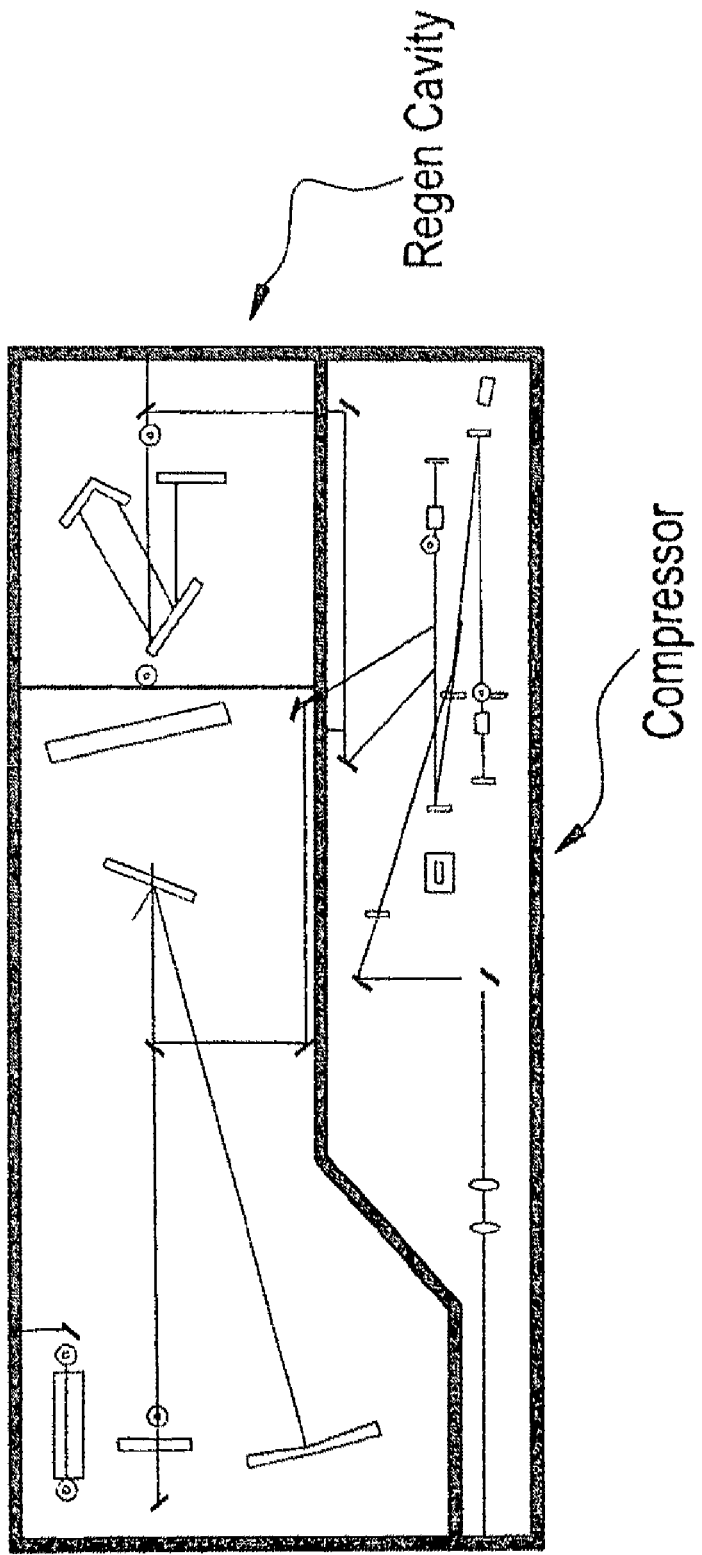
FIG. 6 shows a femtosecond laser regenerative amplifier diagram.

FIG. 6 shows a femtosecond laser regenerative amplifier diagram. A femtosecond pulsed laser regenerative amplifier diagram has the following operating specifications:

Average Power 750 mW
PulseRepRate: 1 kHz
Pulse Width: less than 50 fs
Wavelength: 780-820 nm
Beam Diameter 7 mm
Energy Per Pulse: 750 μm
Energy Stability: 1%
Spatial Model: $TEM_{00}$
Polarization: Linear/Horizontal FIG. 7 shows an infrared camera 9 and its specifications. The ThermaCAM S65HSV Infrared Camera has a price of $70,000.

Four temperature ranges are: Range 1: −40° C. to +120° C. (−40° F. to +240° F.) Range 2: 0° C. to +250° C. (+32 F to +482 F) Range 3: +100° C. to +500° C. (+212° F. to +932° F.) Range 4: +250° C. to +1500° C. (+482° F. to +2732° F.)

The spectral range of detector is:

7.5 um to 13 um. This is deep infrared.

Accuracy: as a % of reading is +2° C. or ±2% (3.6° F.)

Emissivity corrections are variable from 0.1 to 1.0 or select from listings in predefined material list.

Thermal sensitivy is of 0.05° C.

The camera has 640×480 pixels in full color and high-resolution 14-bit thermal images.

FIG. 8 is a chart of advantages of femtosecond pulses vs. nanosecond pulses. Femtosecond vs. nanosecond pulses are as follows: Nanosecond pulses do not create the unique nano surface structures. Nanosecond pulses create large amounts of heating damage in the form of melting splatter and stress cracking.

Femtosecond pulses stop before the material plasma has time to form. Femtosecond pulses have improved repeatability over nanosecond pulses.

As shown in the chart in FIG. 8, plasma formation occurs in the following steps. In the first 100 femtoseconds (fs) electron heating and thermalization occurs. It takes a few picseconds (ps) for the hot electron gas to cool and energy to transfer to the material lattice. After tens of ps thermal diffusion into the sample bulk takes place. After nanseconds the onset of thermal melting and ablation occurs.

Figure 9:
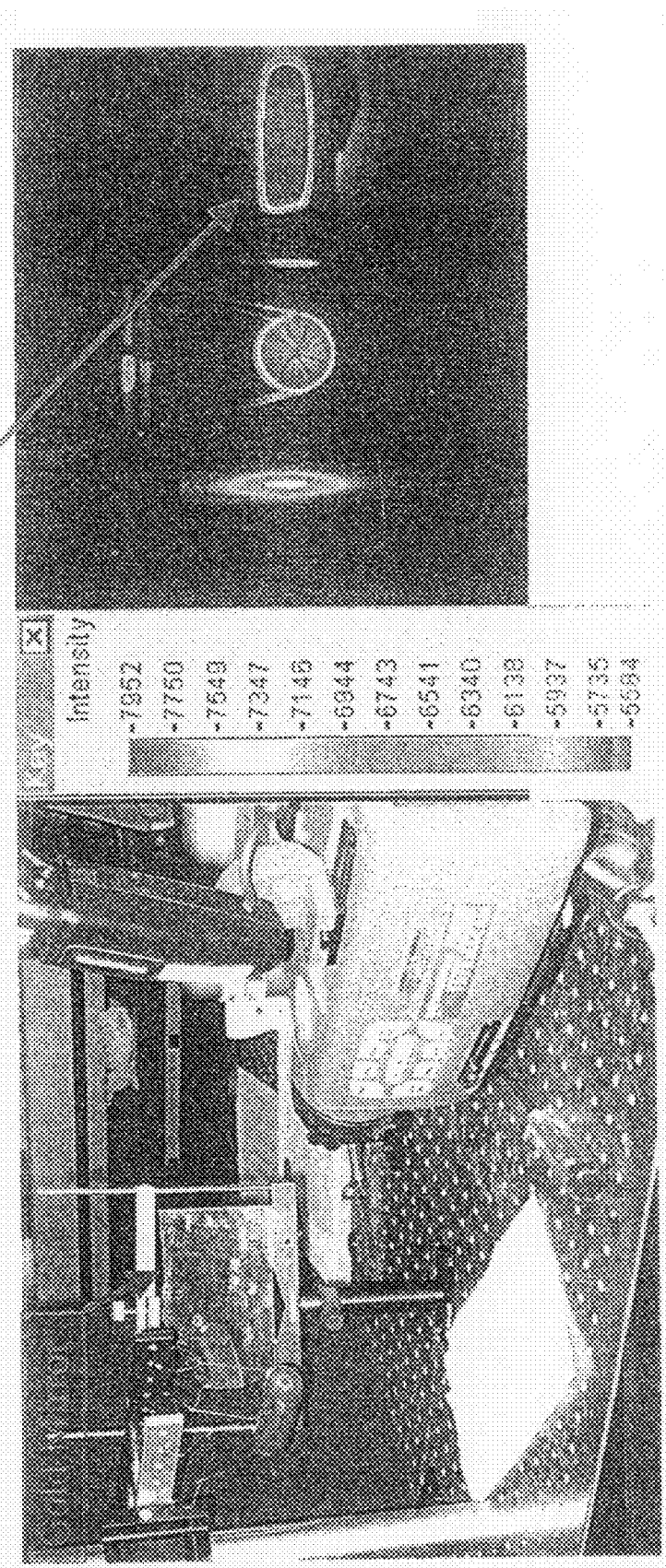
FIG. 9 shows the infrared imaging of an object.

FIG. 9 shows the infrared imaging of an object to determine temperature as pointed out in the figure.

Figure 10:
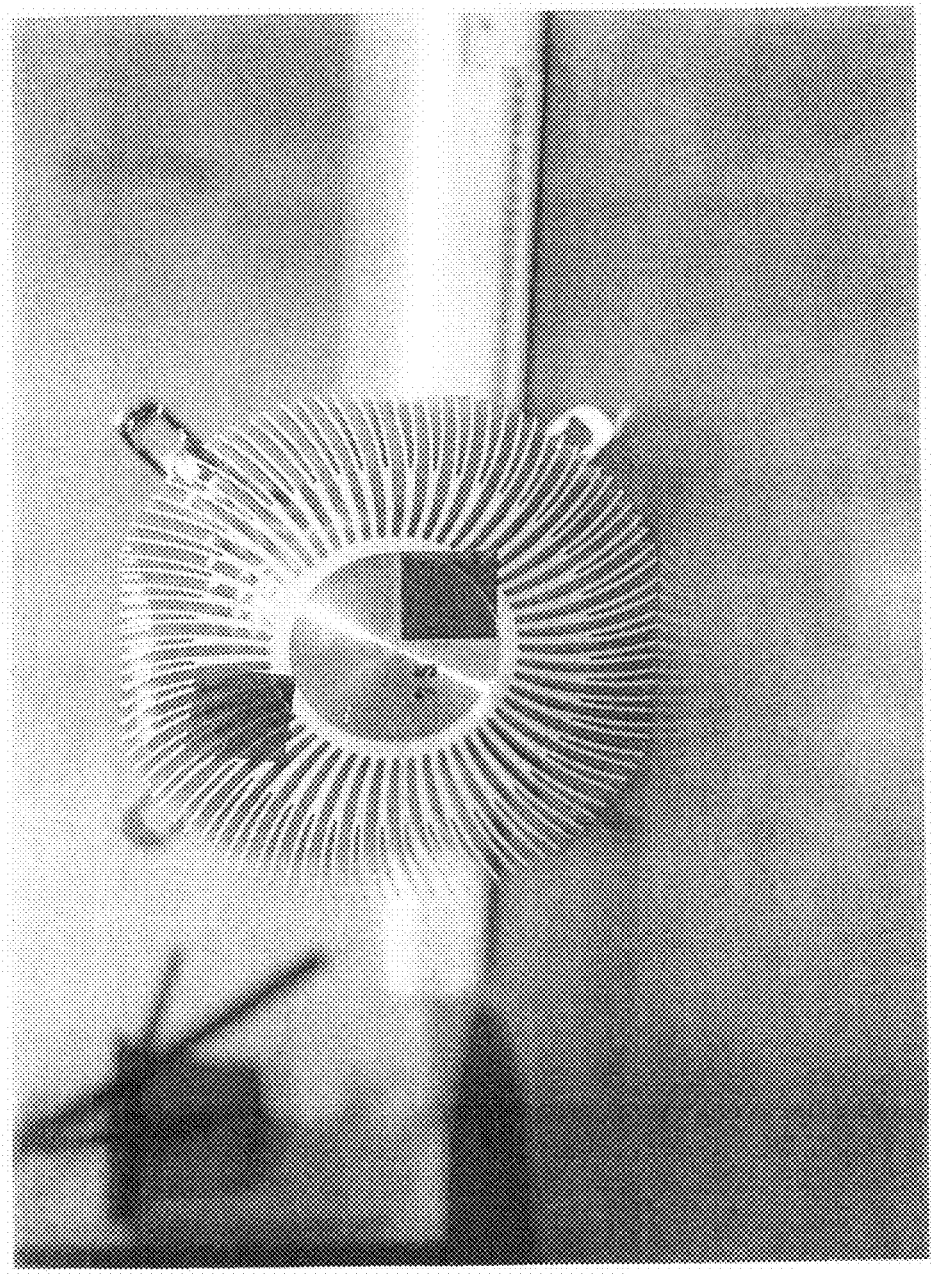
FIG. 10 shows a heat sink.

FIG. 10 shows a heat sink 10.

Figure 11:
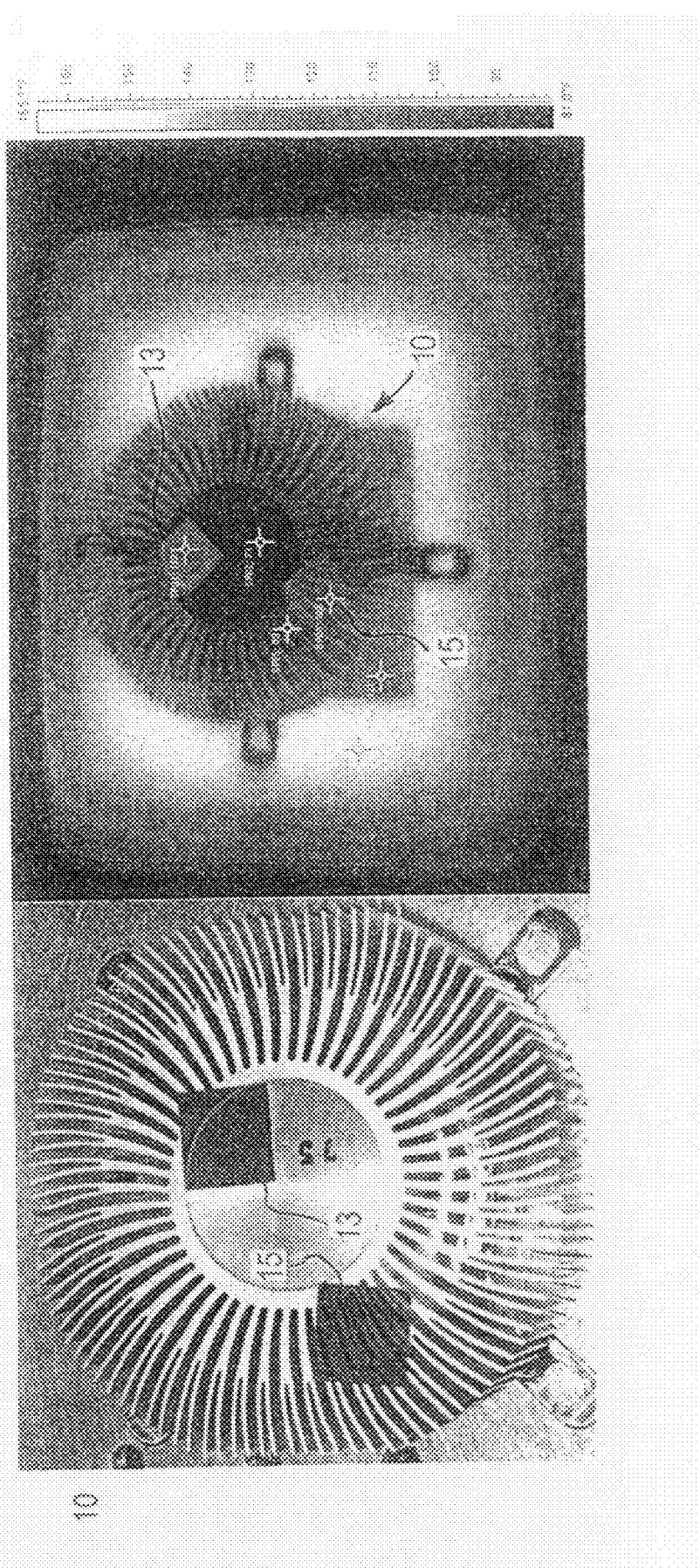
FIG. 11 shows machining and infrared imaging of the heat sink.

FIG. 11 shows two femtosecond pulsed laser machined areas 13, 15 on the heat sink 10 and infrared imaging of the heat sink showing higher temperatures of the machined areas 13, 15 compared to the rest of the heat sink 10.

Figure 12:
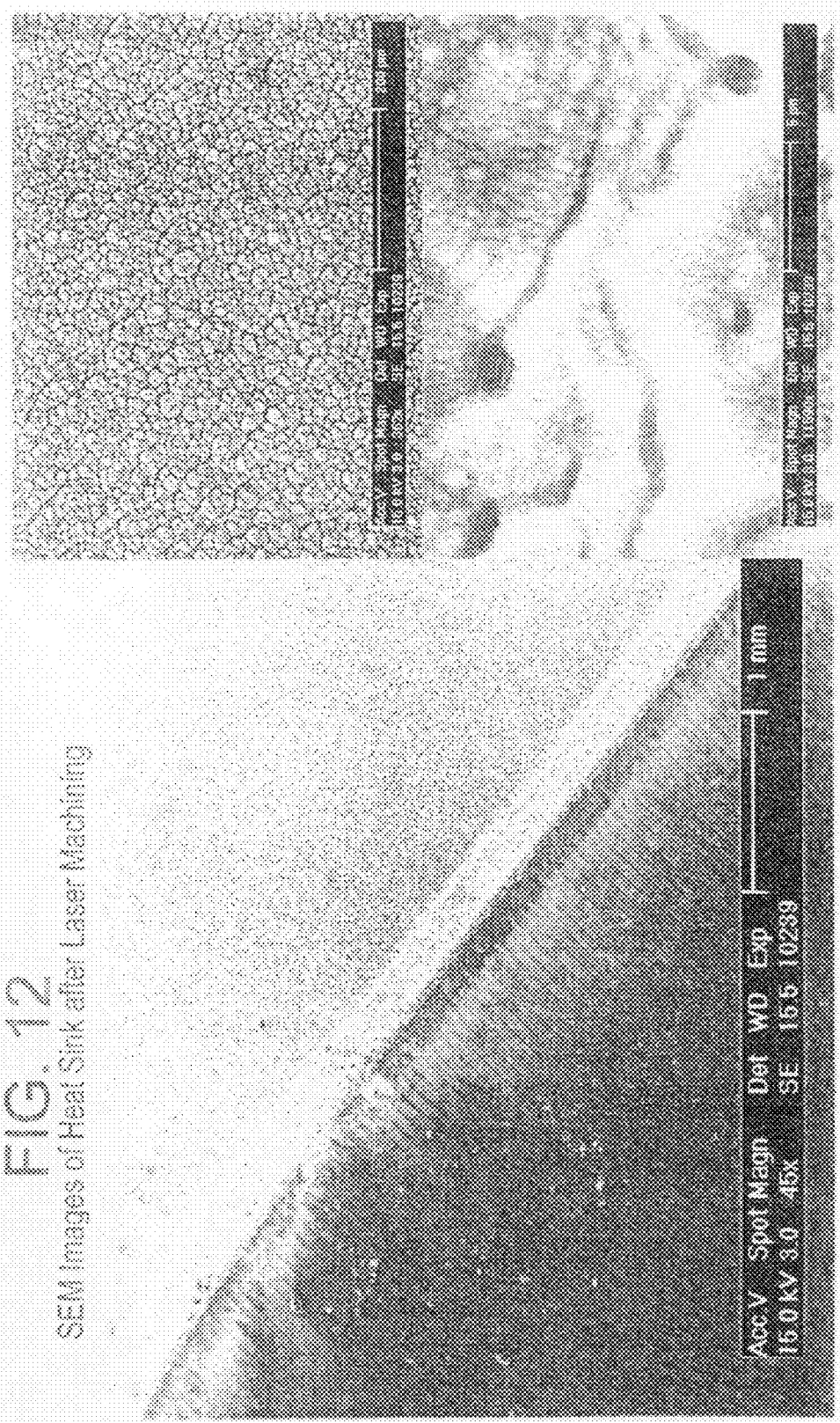
FIG. 12 shows SEM images of a heat sink after laser machining.

FIG. 12 shows SEM images of a heat sink 10 after laser machining. The machined area 13 is shown at the upper right of the left image at 45× magnification. The images at the upper and lower positions at the right of FIG. 12 show the machined area in 362× and 11,590× magnification respectively.

Figure 13:
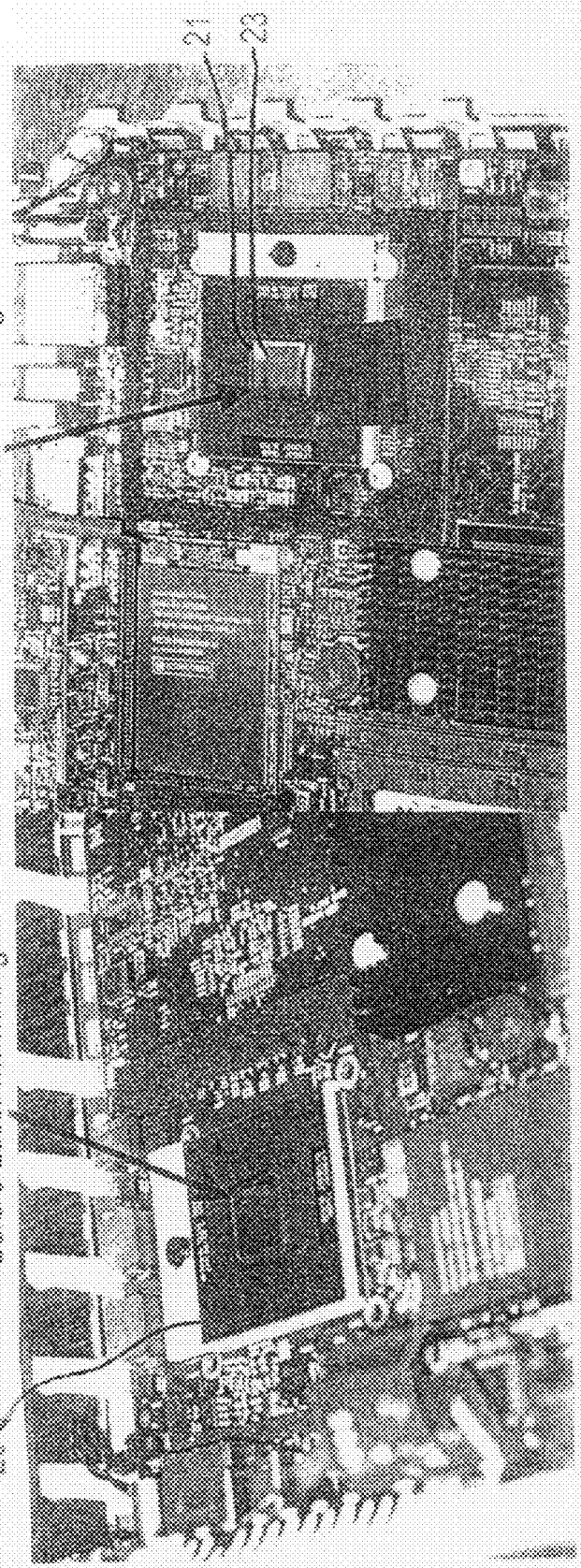
FIG. 13 shows a micro processor before and after machining.

FIG. 13 shows a microprocessor 20 before and after machining, SEM images of stainless steel square before and after laser machining, a stainless steel square 21 with a central femtosecond pulsed laser machined center 23, infrared wavelengths in the electromagnetic spectrum and time scale relationships of femtoseconds.

Figure 14:
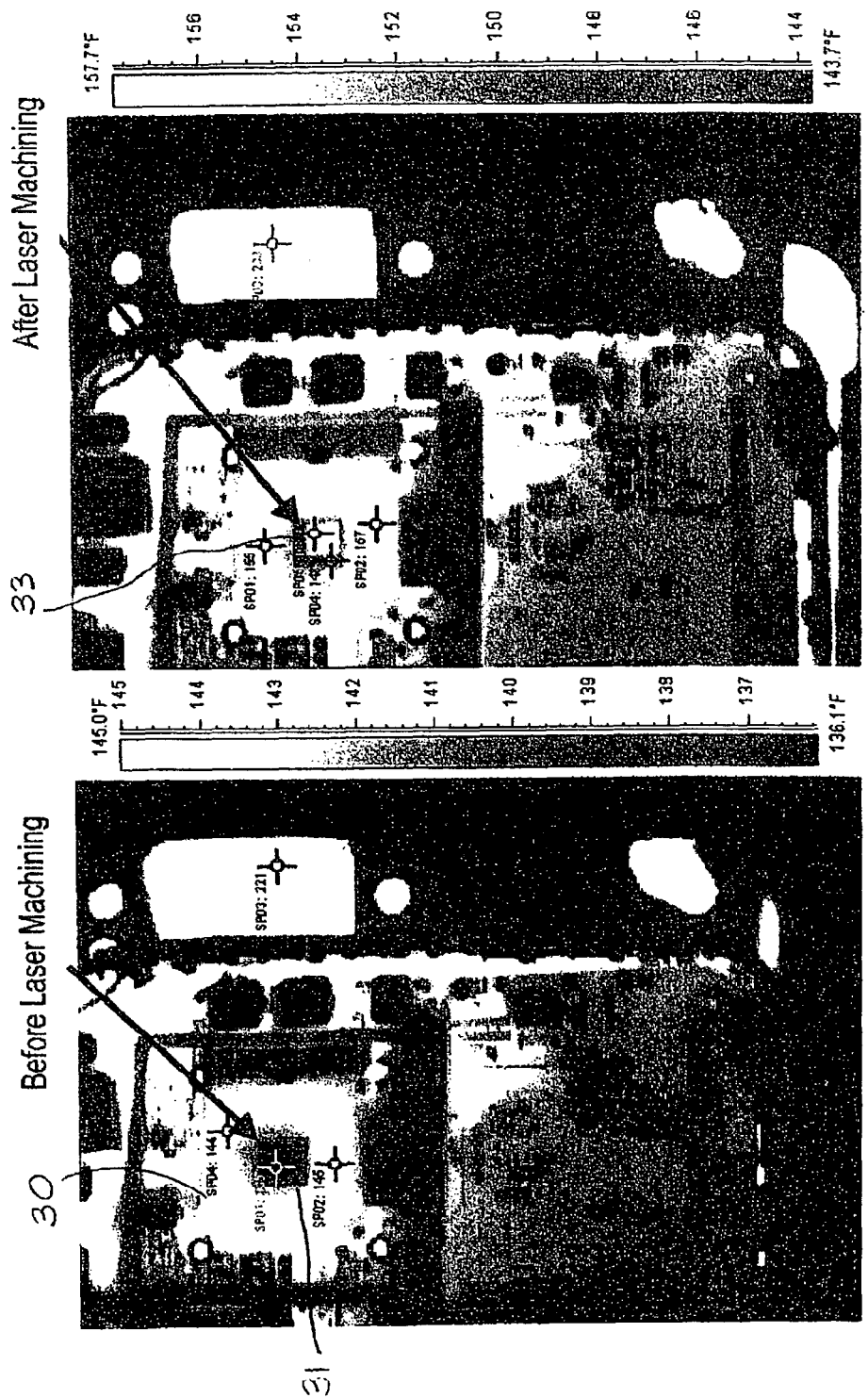
FIG. 14 shows infrared images of the microprocessor before and after machining.

FIG. 14 shows infrared images of a miniprocessor 30 before and after machining. Before laser machining, the infrared image 31 of the miniprocessor is black, showing a low temperature and lesser possibility of heat transfer away from the miniprocessor. After laser machining, the miniprocessor image 33 is show bright and hotter, aiding heat flow away from the miniprocessor 30.

Figure 15:
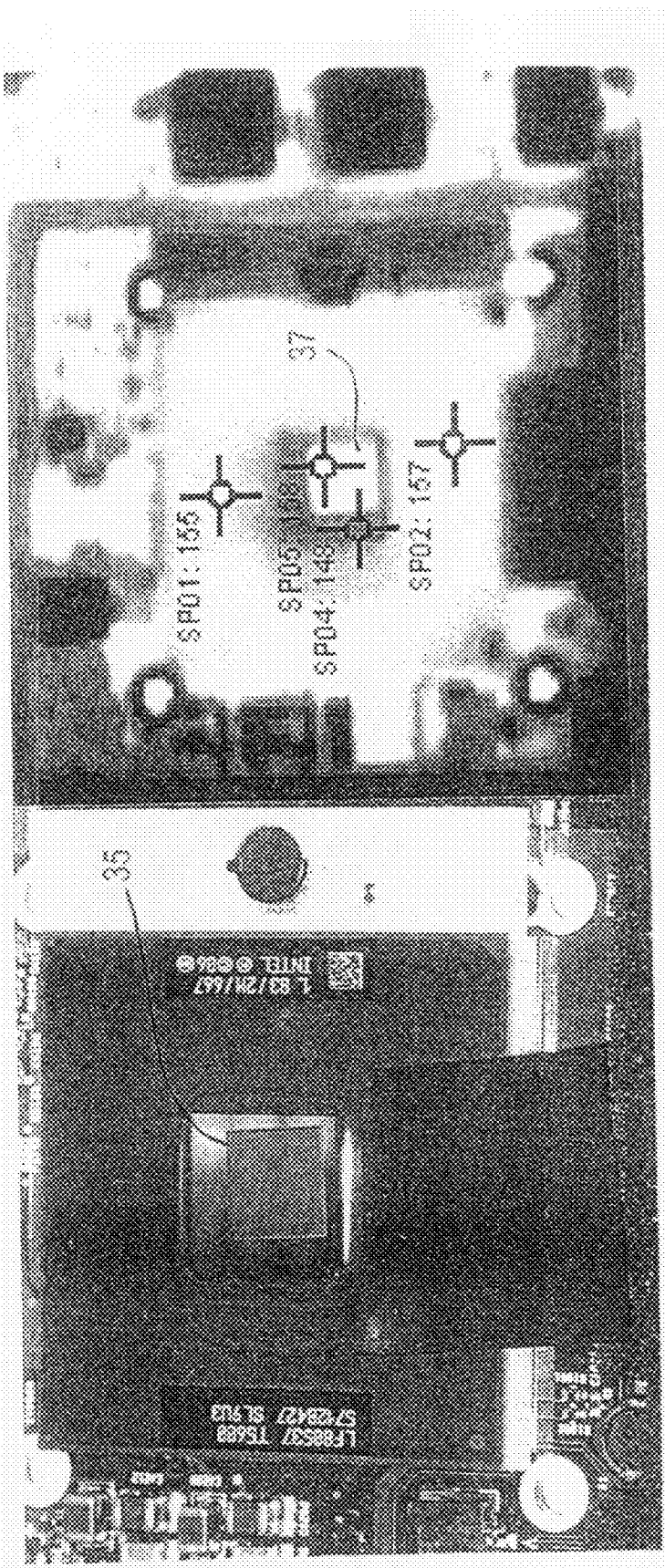
FIG. 15 shows a micro processor after machining and its infrared imaging.

FIG. 15 shows a micro processor after machining and its digital and infrared imaging. The images in FIG. 15 show the miniprocessor 30 with a dark, now reflective, high surface area 35. The image 37 at the right is an IR image showing the machined area is brighter and therefore hotter and more capable of heat transfer.

While the invention has been described with reference to specific embodiments, modifications and variations of the invention may be constructed without departing from the scope of the invention, which is defined in the following claims.

I claim:

1. Apparatus comprising electronic components and microprocessor outer surfaces having rapid heat dissipation surfaces having sub-micrometer irregularities machined by femtosecond pulsed laser machining.

2. The apparatus of claim 1, wherein the electronic components comprise microprocessors and the heat dissipation surfaces comprise external housings of the microprocessors having femtosecond pulsed laser machined surfaces for increasing heat dissipation by electromagnetic radiation and cooling of the microprocessor housings and electronic components therein.

3. The apparatus of claim 2, wherein the femtosecond pulsed laser machined surfaces are on thin foils connected to the microprocessors.

4. The apparatus of claim 1, wherein the electronic components comprise miniprocessors and the heat dissipation surfaces comprise external housings having femtosecond pulsed laser machined surfaces for increasing heat dissipation by electromagnetic radiation and cooling of the miniprocessor housings and electronic components therein.

5. The apparatus of claim 4, wherein the femtosecond pulsed laser machined surfaces are on thin foils connected to the miniprocessors.

6. The apparatus of claim 1, wherein the electronic components and housings comprise heat sinks having flat cores and fins, and wherein heat sink surfaces are machined by femtosecond pulsed laser machining.

7. The apparatus of claim 6, wherein only the flat core surfaces on the heat sinks are femtosecond pulsed laser machined.

8. The apparatus of claim 6, wherein the flat core surfaces and the fins on the heat sinks are femtosecond pulsed laser machined.

9. The apparatus of claim 6, wherein fins on the heat sinks are femtosecond pulsed laser machined.

10. The apparatus of claim 1, wherein the machined surfaces have nano structures formed by the femtosecond pulsed laser machining.

11. The apparatus of claim 1, wherein the machined surfaces have over 21 times a surface area of the surface before machining.

12. The apparatus of claim 11, wherein the surfaces are outer surfaces on microprocessors.

13. The apparatus of claim 1, wherein the femtosecond pulsed laser machined surfaces are on thin foils connected to the electronic components.

\* \* \* \* \*